United States Patent [19]

Tonai

[11] Patent Number: 5,365,101
[45] Date of Patent: Nov. 15, 1994

[54] PHOTO-SENSING DEVICE

[75] Inventor: Ichiro Tonai, Osaka, Japan

[73] Assignee: Sumitomo Electric Industries, Ltd., Osaka, Japan

[21] Appl. No.: 93,707

[22] Filed: Jul. 20, 1993

Related U.S. Application Data

[63] Continuation of Ser. No. 751,187, Aug. 29, 1991, abandoned.

[30] Foreign Application Priority Data

Aug. 31, 1990 [JP] Japan .................. 2-230208

[51] Int. Cl.$^5$ .............................. H01C 23/90
[52] U.S. Cl. ................................ 257/434; 257/435
[58] Field of Search ............. 357/19; 257/434, 435

[56] References Cited

FOREIGN PATENT DOCUMENTS

| | | | |
|---|---|---|---|
| 55-74190 | 6/1980 | Japan | 357/19 |
| 58-48481 | 3/1983 | Japan | 357/19 |
| 02155278 | 6/1990 | Japan | 357/19 |

OTHER PUBLICATIONS

C. S. Yin et al, "High Quantum Efficiency p+/pi/n−/N+ Silicon Photodiode", IEE Proceedings J. Optoelectronics, vol. 137, No. 3 Jun. 1990, Stevenage GB, pp. 171–173.

S. Kagawa et al, "Wide–wavelength–InGaAs/InP PIN Photodiodes Sensitive from 0.7 to 1.6 mum", Japanese Journal of Applied Physics vol. 28, No. 10, Oct. 1989, Tokyo JP pp. 1843–1846.

*Primary Examiner*—Ngan V. Ngo
*Assistant Examiner*—Stephen D. Meier
*Attorney, Agent, or Firm*—Beveridge, DeGrandi, Weilacher & Young

[57] ABSTRACT

A bottom-incidence type photo-sensing device has a pn junction, as a photo-sensing region, formed by selectively providing a first region of a second conductivity type in a portion of a semiconductive layer of a first conductivity type. The first region is surrounded by a second region of the second conductivity type formed in the semiconductive layer, and the second region is of the same or larger depth as or that of the first region. Even when light is directed to outside of the photo-sensing region, extra charges generated therein are absorbed by the second region and the flow of extra charges into the photo-sensing region is prevented.

20 Claims, 5 Drawing Sheets

PHOTO-SENSING DEVICE

This application is a continuation of application 07/751,187, filed Aug. 29, 1991, which application is entirely incorporated herein by reference.

BACKGROUND OF THE INVENTION

1. Field of the Invention

The present invention relates to a photo-sensing device used as a photo-sensor of a light communication system.

2. Related Background Art

FIGS. 1A and 1B respectively show a structure of a prior art photo-sensing device. FIG. 1A shows a top view and FIG. 1B shows an X—X sectional view. As shown, in the prior art photo-sensing device, an electrode 8 having a center opening through which light is directed is formed on an underside of a semiconductor substrate 1 of a first conductivity type which is transparent to the light to be detected, and an anti-reflection film 9 is formed in the opening. A semiconductive crystal layer 2 of the first conductivity type for absorbing the incident light is formed on the surface of the semiconductor substrate 1. The semiconductive crystal layer 2 is a lamination of a buffer layer 2a, a photo-sensing layer 2b and a cap layer 2c in sequence. Impurities are selectively diffused into the semiconductive crystal layer 2 to form a first region 3 of a second conductivity type. This is a pin photo-diode structure where the semiconductor substrate 1 is an n layer (or a p layer), the semiconductive crystal layer 2 is an i layer and the first region 3 is a p layer (or an n layer), and a photo-sensing region 10 is formed in the i layer. An electrode 5 for taking out a photo-current is formed on the first region 3, the surface of the semiconductive crystal layer 2 around the electrode 5 is covered with a protection film (i.e. passivation film) 7.

When a reverse bias is applied to the semiconductor device thus constructed, a depletion layer is created in a pn junction area in the semiconductive crystal layer 2. Thus, an electric field is developed in the depletion layer and electrons and holes generated by a light applied to the photo-sensing region 10 are directed to the semiconductor substrate 1 and the first region 3 of different conductivity types, respectively, and accelerated thereby. In this manner, a photo-current is taken out and a light signal is detected.

A similar structure of a photo-sensing device to that described above is disclosed in U.S. Pat. No. 6,093,174 (issued on '84,05.11).

In the structure shown in FIGS. 1A and 1B, when the light is applied to the photo-sensing region 10, light generating carriers are captured by the depletion layer and a good response characteristic is offered. However, when the light is directed to the outside of the region 10, the generated carriers reach the pn junction while they are diffused by a density gradient and are taken out as a photo-current. As a result, the response characteristic is adversely affected. FIG. 2A shows a response characteristic of the photo-sensing device. Since the movement of the carriers by the diffusion is slow, a response waveform to a light pulse includes a tail at the end as shown in FIG. 2A.

When such a photo-sensing device is used for light communication, a light emitted from an optical fiber is focused so that it is directed to the photo-sensing region 10. However, when a portion of light leaks out of the photo-sensing region 10, it leads to the reduction of the response speed of the photo-sensing device by the reason described above. In a high speed photo-sensing device, the area of the photo-sensing region 10 is reduced for reduction of a junction capacitance. As a result, a ratio of light directed to the outside of the photo-sensing region 10 increases and a diffused component which has a low response speed increases. This leads to the degradation of the response speed.

A rear-entry type structure as shown is suitable for use as a high response speed device because of a small junction area. However, when it is coupled to a single mode fiber (core diameter 10 μm), a portion of an incident light leaks to the outside of the photo-sensing region 10 due to a deviation of an optical axis or an aberration of a lens. The length of diffusion of carriers is in the order of several tens μm (approximately 40 μm in the n-type indium-gallium-arsenide layer with the indium-phosphide cap layer), and the carriers generated at a distant point from the pn junction also contribute to the photo-current by the diffusion. This also leads to the reduction of the response speed.

SUMMARY OF THE INVENTION

The photo-sensing device of the present invention is a rear-entry type photo-sensing device having a pn junction area, as a photo-sensing region, formed by selectively providing a first region of a second conductivity type in a portion of a semiconductive layer of a first conductivity type. The first region is surrounded by a second region of the second conductivity type formed in the semiconductive layer, and the second region is of the same or larger depth as or than that of the first region.

Accordingly, even if the light to be directed to the photo-sensing region is directed to the outside of the photo-sensing region to generate charges, the charges are collected to the second region and the flow of the charges into the photo-sensing region is prevented. Thus, only the required photo-current is take out to an external circuit.

It is one object of the present invention to provide a rear-entry type photo-sensing device having a pn junction area, as a photo-sensing region, formed by selectively providing a first region of a heavily doped second conductivity type into a portion of a lightly doped semiconductive layer formed on a semiconductor substrate of a heavily doped first conductivity type, in which the first region is surrounded by a second region of the second conductivity type formed on a portion of the semiconductive layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The embodiments of the present invention are now explained with reference to the drawings.

Figure 3A:
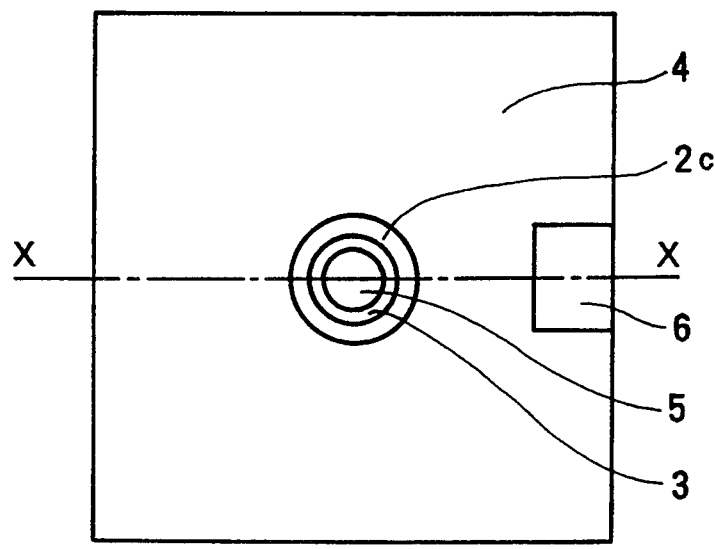
FIGS. 3A and 3B show a structure of a photo-sensing device in accordance with a first embodiment of the present invention.
Figure 3B:
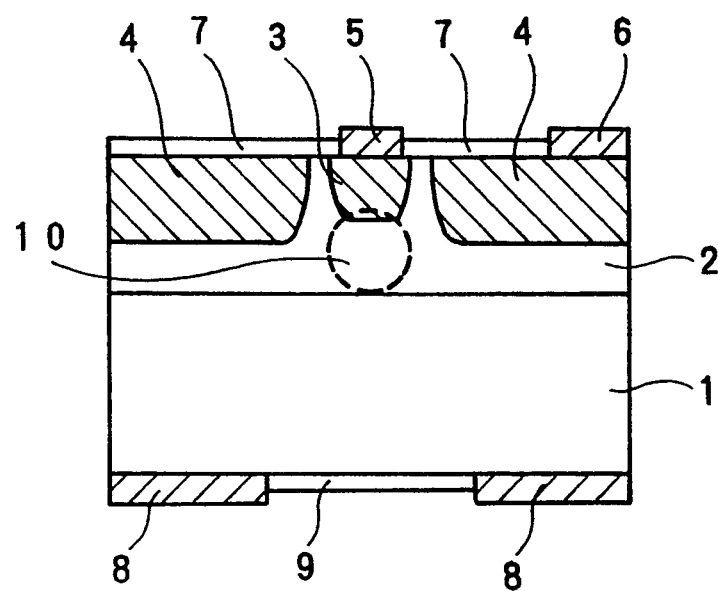

FIGS. 3A and 3B respectively show a basic structure of a photo-sensing device of the present invention. FIG. 3A shows a top view and FIG. 3B shows an X—X sectional view. As shown, an n electrode 8 having a center opening through which a light is directed is formed on an underside of substrate 1 of a heavily doped first conductivity type, and the opening is covered by an anti-reflection film 9 to eliminate a reflection loss of the light. A lightly doped first conductivity type photo-sensing layer 2 is formed on the surface of the semiconductor substrate 1. A first region 3 of a second conductivity type is formed on the surface of the photo-sensing layer 2 at a position facing the opening, by the selective diffusion using a sealed ampoule method (impurity doping method using a sealed silica tube including a semiconductor wafer and an impurity material), and a second region 4 of a second conductivity type is formed in a similar manner with a spacing of 5 μm from the first region 3 so as to surround the first region 3. The deeper the second region 4 becomes than the first region 3, the higher a capture effect for extra charges is, because the extra charges are generated in the photo-sensing layer outside the photo-sensing region and diffuse into the photo-sensing region 10 by the density gradient. Accordingly, the second region 4 may be deep enough to reach the buffer layer 2a. However, it is not necessary to be so deep. For example, when the first region 3 and the second region 4 are simultaneously formed, they are of the same depth. Even in this case, the same effect as that of the present embodiment is attained. However, when the second region 4 is shallower than the first region 3, the above effect becomes lower.

A p-electrode 5 is formed on the first region 3 on the surface of the photo-sensing layer 2, and an auxiliary electrode 6 to which a reverse voltage is applied is formed on a portion of the second region 4 to take out the charges collected to the second region 4. The surface of the photo-sensing layer 2, excluding the electrode 5 and 6, is covered with a device protection film 7.

In the structure such as the above embodiment in which the semiconductive crystal layer 2 is used as an i layer of a pin photo-diode, generally, the addition of the impurities is not performed in the crystal growth. But the semiconductive crystal layer may become the first conductive type semiconductor layer by a local stoichiometric shift in some kind of material or by mixture of the impurities from a crystal growing apparatus etc. Further, in order to improve the electrical characteristics of a device, the impurities may be added in formation of the semiconductor crystal layer 2. Therefore, in the present application, the meaning of "lightly doped" also includes a case that "the intentional addition of the impurities is not performed".

Figure 4A:
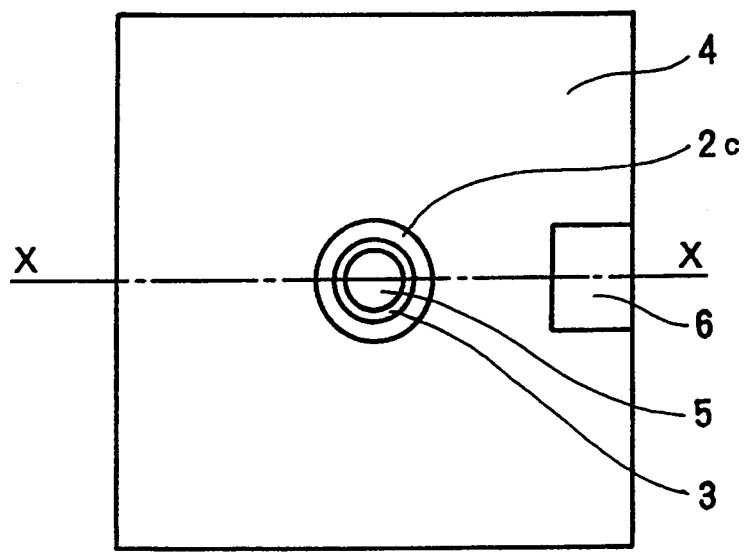
FIGS. 4A and 4B show a structure of a photo-sensing device in accordance with a second embodiment of the present invention.
Figure 4B:
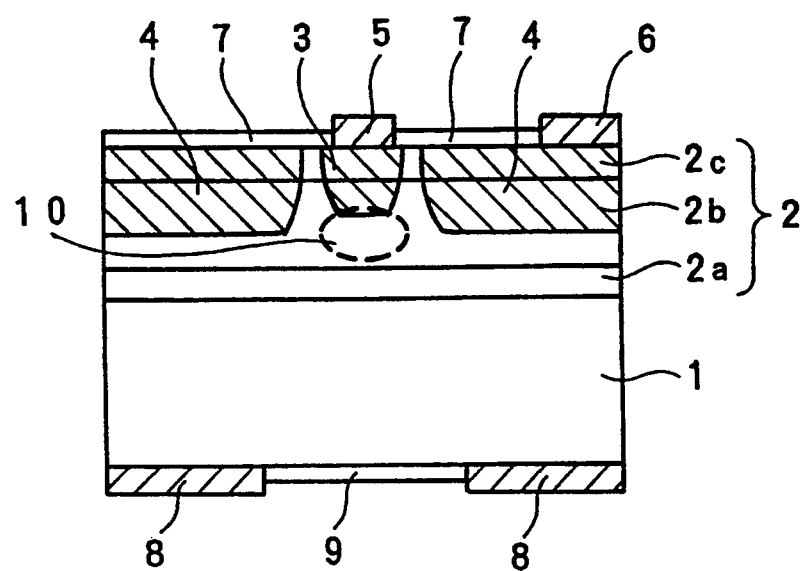

A second embodiment of the present invention is now explained with reference to FIGS. 4A and 4B. FIG. 4A shows a top view and FIG. 4B shows an X—X sectional view. Like in the first embodiment, an n-electrode 8 having a light incidence opening is formed on an underside of an n+-type InP (Indium-phosphide) substrate 1 ($n=2\times10^{18}$ cm$^{-3}$), and the opening is covered with an anti-reflection film 9. A non-doped InP buffer layer 2a ($n=2\times10^{15}$ cm$^{-3}$ thickness 2 μm), a non-doped InGaAs (Indium-gallium-arsenide) photo-sensing layer 2b ($n=2\times10^{15}$ cm$^{-3}$, thickness 3.5 μm) and a lightly doped InP cap layer 2c ($n=2\times10^{16}$ cm$^{-3}$, thickness 1 μm) are sequentially laminated, as a semiconductor crystal layer 2, on the n+-type InP substrate 1. A first region 3 and a second region 4 of p-type are formed by the selective diffusion of Zn using the sealed ampoule method. The diameter of the first region 3 is 100 μm, and the width of the n-type region between the region 3 and the surrounding region 4 is 10 μm. A p electrode 5 is formed on the first region 3 on the semiconductive crystal layer 2, and an auxiliary electrode 6 for taking out the charges collected to the second region 4 is formed on a portion of the second region 4. The periphery thereof is covered with a device protection film 7.

Since the cap layer 2c is formed by the material having a wider band gap than that of the photo-sensing layer 2b, a surface leakage current is minimized. Further, since undesired charges are absorbed by the region 4, only the current required for the detection of the light signal is taken out.

Figure 5:
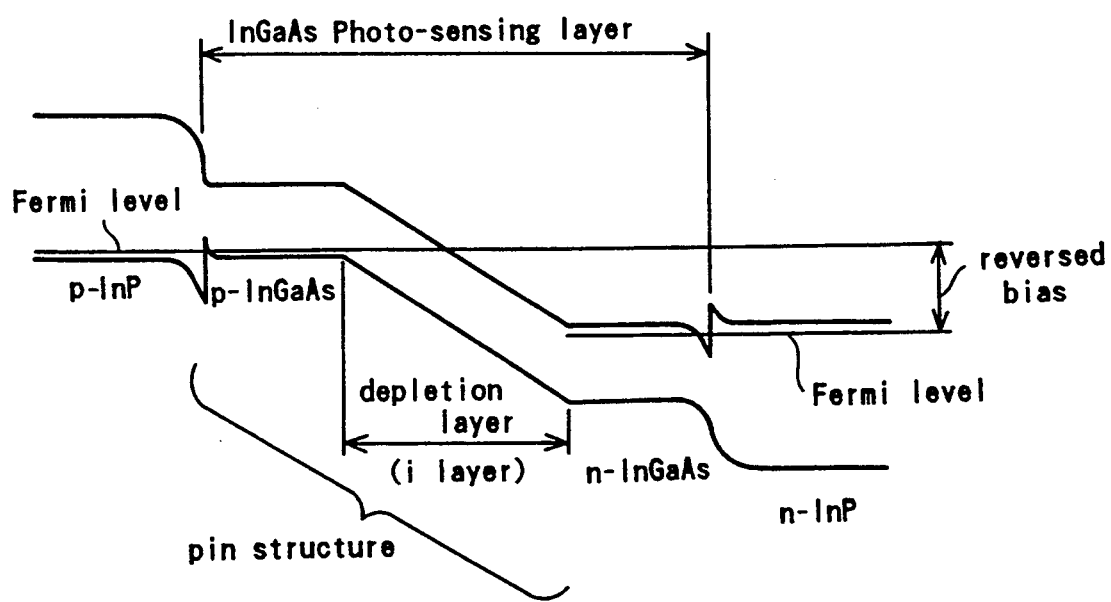
FIG. 5 shows a band gap energy chart of the pin structure.

A band gap energy chart of the pin structure is shown in FIG. 5. In the present embodiment, the composition of InGaAs of the photo-sensing layer 2 is $In_{0.53}Ga_{0.47}As$. This composition provides the smallest band gap energy, that is, can sense the longest wavelength light among the InGaAsP semiconductors which can be lattice-matched with the InP layer.

It is preferable that the thickness of the photo-sensing layer 2 is between 1 μm and 7 μm to attain efficient absorption of the incident light, although it is not limited thereto. It is further preferable that the spacing between the first region 3 and the second region 4 is between 5 μm and 30 μm in order to attain a good response characteristic and electrical characteristic, although it is not limited thereto.

Figure 1A:
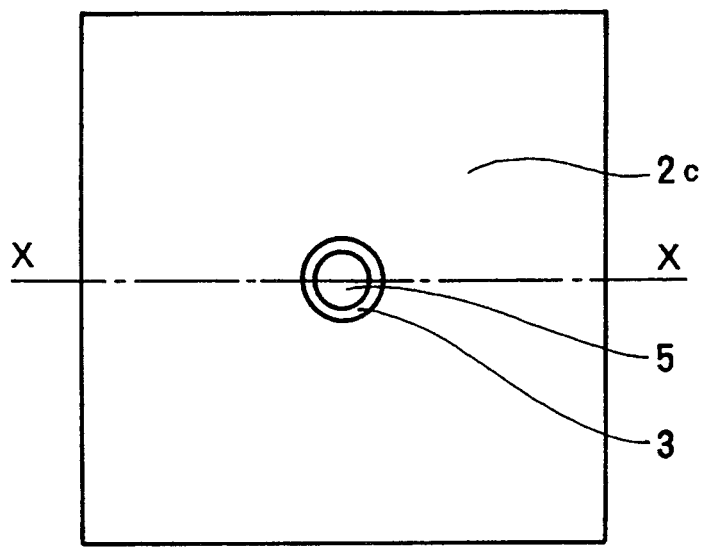
FIGS. 1A and 1B show a structure of a prior art photo-sensing device.
Figure 1B:
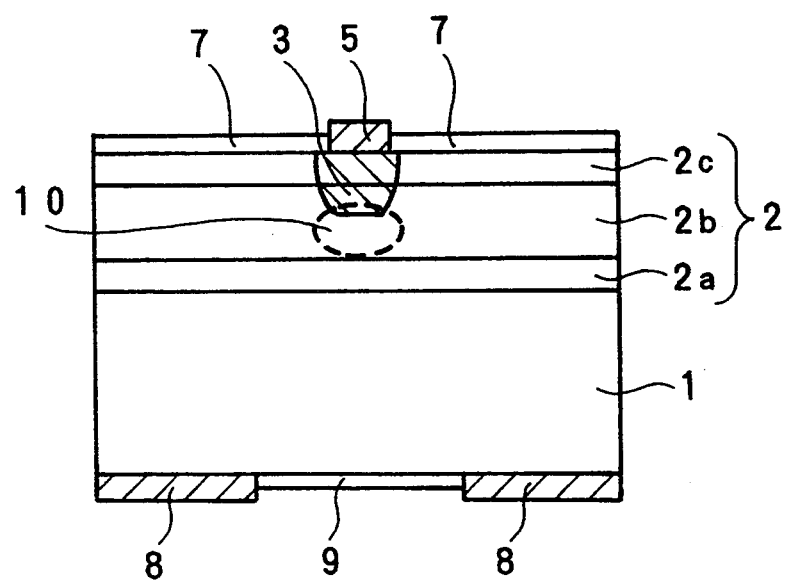
Figure 2A:
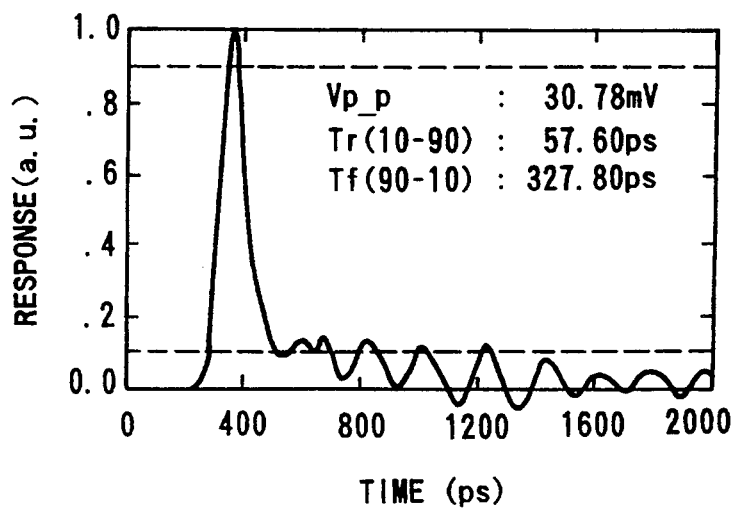
FIGS. 2A and 2B respectively show a light pulse response characteristic measured for a prior art structure and the structure of the present invention.
Figure 2B:
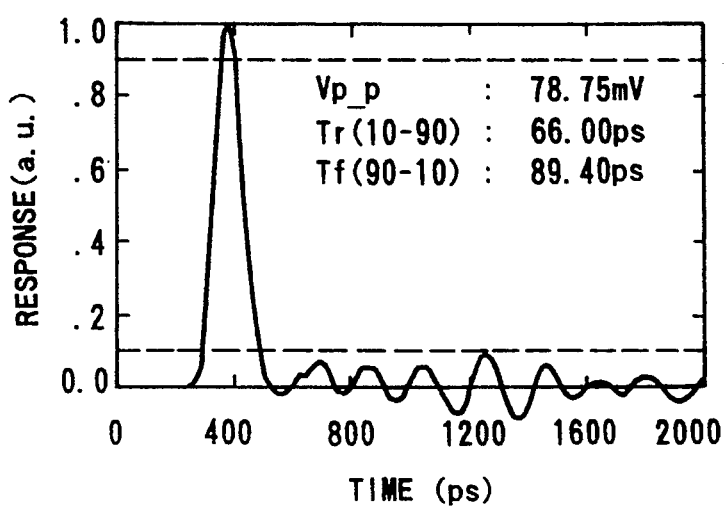

In the photo-sensing device of the above structure, charges generated by the light directed to the outside of the photo-sensing area 10 are collected by the depletion layer created by the second region 4. Accordingly, only the photo-current required for the detection of the light signal is taken out. The response speed of the photo-sensing device was measured. FIGS. 2B shows a light pulse response characteristic measured in the pin photo diode of the present invention as shown in FIGS. 4A and 4B. As shown in FIG. 2B, the end of the waveform includes no tail and no degradation of the response speed by the stray light directed to the outside of the photo-sensing region 10 was confirmed.

In the present embodiment, the incident light has a wavelength of 1.3 μm. Since the photo-sensing layer 2 is the In$_{0.53}$Ga$_{0.47}$As layer, the same effect is attained for an incident light of a long wavelength such as 1.55 μm.

A structure for absorbing the undesired charges by an impurity layer is disclosed in Japanese Laid-Open Patent Application No. 53-96719/1978. It teaches the provision of the impurity layer in order to prevent interference between a photo-sensing device and a scan circuit in an image sensor. However, no undesired charge absorbing region is formed around the photo-sensing device and the improvement of the response speed is not attained.

The semiconductor materials and the dimensions thereof are examples and they are changed depending on applications and wavelengths. For example, the semiconductor materials may be compound semiconductors such as GaAs (gallium-arsenide), AlGaAs (aluminum-gallium-arsenide), CaTe (cadmium-telluride), HgCdTe (mercury-cadmium-telluride), InSb (indium-antimonide), or Si (silicon) or Ge (germanium). The impurities to be selectively diffused may be Be (beryllium) or Cd (cadmium). The impurity diffusion to form the first and second regions 3 and 4 may be done by an ion implantation method.

In accordance with the present invention, the charges generated by the light directed to the outside of the photo-sensing region are collected by the simple structure of forming the region of the second conductivity type in the rear-entry type photo-sensing device to surround the photo-sensing region, and the degradation of the response speed is prevented.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A photo-sensing device for receiving light on a bottom surface thereof and converting the light to an electric signal, said device comprising:
   a semiconductor substrate having a first main surface and a second main surface;
   a semiconductive layer of a first conductivity, said semiconductive layer having a main surface, and said semiconductive layer being located above the first main surface of said semiconductor substrate;
   a first region of a second conductivity type, said first region extending into said semiconductive layer from said main surface thereof, said semiconductive layer and said first region being in contact to define a pn junction which provides a photo-sensing region;
   a second region of a second conductivity type, said second region extending into said semiconductive layer from said main surface thereof, said second region surrounding said first region and being spaced apart from said first region, wherein a depth of said second region is deeper, in a direction from said first main surface of said semiconductor substrate to said second main surface thereof, than a deepest depth of said first region;
   a first electrode located on the second main surface of said semiconductor substrate and having a window for passing light incident on the second main surface side of said semiconductor substrate to said pn junction; and
   a second electrode in electrical communication with said first region,
   wherein light passing through said window from said second main surface side of said semiconductor substrate is incident on said photo-sensing region and is converted into an electric signal.

2. A photo-sensing device according to claim 1, wherein said semiconductive layer is made by crystal growth of a semiconductor having the same composition as that of the semiconductor substrate on which said layer is provided.

3. A photo-sensing device according to claim 2, wherein a reverse voltage is applied between said first region and said semiconductive layer.

4. A photo-sensing device according to claim 2, wherein a charge take-out electrode is formed on said second region.

5. A photo-sensing device according to claim 1, wherein said semiconductive layer is a lamination of a plurality of semiconductive layers having lower impurity concentrations than that of said semiconductor substrate, and at least one of said plurality of semiconductive layers which does not contact said semiconductor substrate is of a different composition than that of said semiconductor substrate.

6. A photos-sensing device according to claim 5, wherein said semiconductor substrate is an n+-type InP (indium-phosphide) substrate, and said semiconductive layer is a lamination of an n-type InP buffer layer, an n-type InGaAs (indium-gallium-arsenide) photo-sensing layer, and an n-type InP cap layer in sequence.

7. A photo-sensing device according to claim 6, wherein a charge take-out electrode is formed on said second region.

8. A photo-sensing device according to claim 5, wherein a reverse voltage is applied between said first region and said semiconductive layer.

9. A photo-sensing device according to claim 5, wherein a charge take-out electrode is formed on said second region.

10. A photo-sensing device according to claim 1, wherein a charge take-out electrode is formed on said second region.

11. A photo-sensing device for receiving light on a bottom surface thereof and converting the light to an electric signal, said device comprising:
    a semiconductor substrate having a first main surface and a second main surface;
    a semiconductive layer of a first conductivity, said semiconductive layer having a main surface, and said semiconductive layer being located above the first main surface of said semiconductor substrate;
    a first region of a second conductivity type, said first region extending into said semiconductive layer from said main surface thereof, wherein a depth of said first region is essentially constant in a direction rom said first main surface of said semiconductor substrate to said second main surface thereof, said semiconductive layer and said first region being in contact to define a pn junction which provides a photo-sensing region;
    a second region of a second conductivity type, said second region extending into said semiconductive layer from said main surface thereof, said second region surrounding said first region and being spaced apart from said first region, wherein a depth of said second region is deeper, in said direction from said first main surface of said semiconductor substrate to said second main surface thereof, than said depth of said first region;

a first electrode located on the second main surface of said semiconductor substrate and having a window for passing light incident on the second main surface side of said semiconductor substrate to said pn junction; and a second electrode in electrical communication with said first region, wherein light passing through said window from said second main surface side of said semiconductor substrate is incident on said photo-sensing region and is converted into an electric signal.

12. A photo-sensing device according to claim 11, wherein said semiconductive layer is made by crystal growth of a semiconductor having the same composition as that of the semiconductor substrate on which said layer is provided.

13. A photo-sensing device according to claim 12, wherein a reverse voltage is applied between said first region and said semiconductive layer.

14. A photo-sensing device according to claim 12, wherein a charge take-out electrode is formed on said second region.

15. A photo-sensing device according to claim 11, wherein said semiconductive layer is a lamination of a plurality of semiconductive layer shaving lower impurity concentrations than that of said semiconductor substrate, and at least one of said plurality of semiconductive layers which does not contact said semiconductor substrate is of a different composition than that of said semiconductor substrate.

16. A photo-sensing device according to claim 15, wherein said semiconductor substrate is an $n^+$-type InP (indium-phosphide) substrate, and said semiconductive layer is a lamination of an n-type InP buffer layer, an n-type InGaAs (indium-gallium-arsenide) photo-sensing layer, and an n-type InP cap layer in sequence.

17. A photo-sensing device according to claim 16, wherein a charge take-out electrode is formed on said second region.

18. A photo-sensing device according to claim 15, wherein a reverse voltage is applied between said first region and said semiconductive layer.

19. A photo-sensing device according to claim 15, wherein a charge take-out electrode is formed on said second region.

20. A photo-sensing device according to claim 11, wherein a charge take-out electrode is formed on said second region.

* * * * *